United States Patent [19]

Chui

[11] Patent Number: 4,613,819
[45] Date of Patent: Sep. 23, 1986

[54] NUCLEAR MAGNETIC RESONANCE IMAGING APPARATUS

[75] Inventor: Kui M. Chui, Ickenham, England

[73] Assignee: Picker International Ltd., Wembley, England

[21] Appl. No.: 702,502

[22] Filed: Feb. 19, 1985

[30] Foreign Application Priority Data

Feb. 27, 1984 [GB] United Kingdom ............... 8405065

[51] Int. Cl.⁴ ............................................. G01R 33/20
[52] U.S. Cl. .................................. 324/308; 324/318; 324/300
[58] Field of Search .............. 324/300, 307, 309, 318, 324/322, 308; 128/653

[56] References Cited

U.S. PATENT DOCUMENTS

| | | |
|---|---|---|
| 4,430,616 | 2/1984 | Grover ................................ 324/304 |
| 4,528,510 | 7/1985 | Loeffler ............................... 324/309 |
| 4,551,678 | 11/1985 | Morgan et al. ..................... 324/300 |
| 4,574,240 | 3/1986 | Libove ................................ 324/309 |

FOREIGN PATENT DOCUMENTS 2344751  1/1973  Fed. Rep. of Germany .

Primary Examiner—Michael J. Tokar
Attorney, Agent, or Firm—Timothy B. Gurin

[57] ABSTRACT

A phantom for use in assessing the performance of an NMR imaging apparatus which enables quantitative assessments of image slice width and spatial resolution under different conditions of contrast to be made, and which enables an assessment of overall performance of the apparatus to be made to facilitate comparison of the performance of the apparatus when operating in different modes. The structure and methods of use of the phantom are described.

21 Claims, 10 Drawing Figures

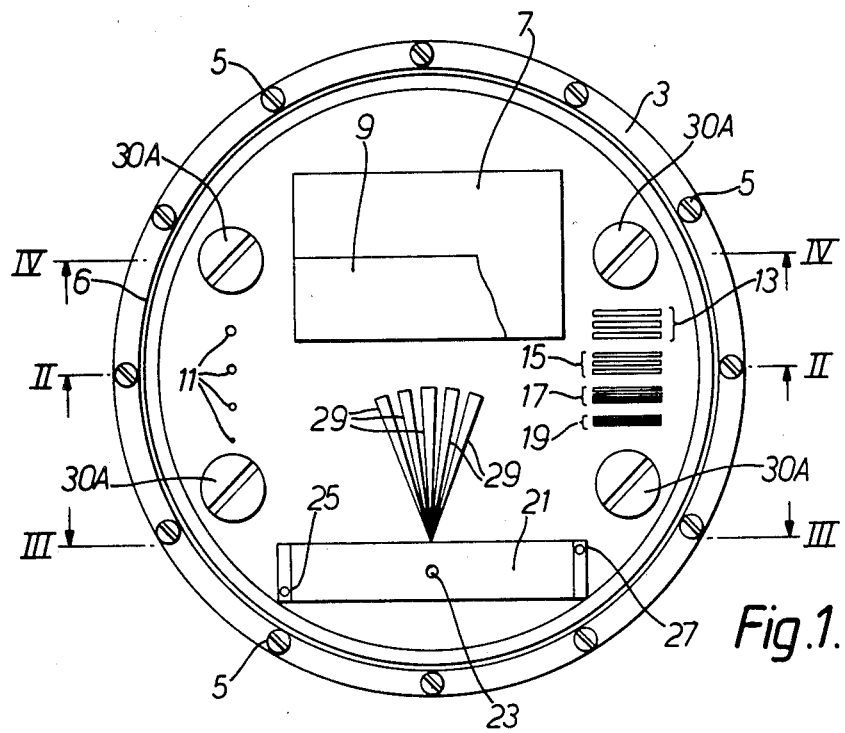
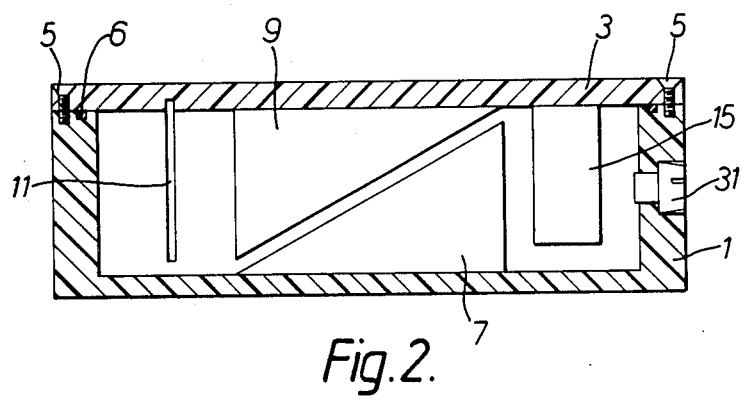
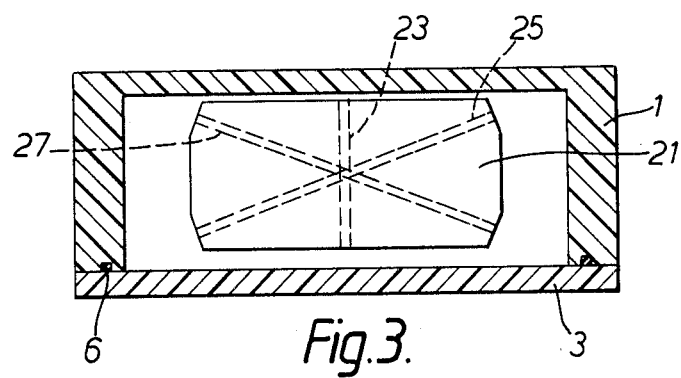

NUCLEAR MAGNETIC RESONANCE IMAGING APPARATUS

This invention relates to nuclear magnetic resonance (NMR) imaging apparatus.

In order to assess the performance of such apparatus use is normally made of a so-called phantom, that is to say, an object so constructed that an assessment of apparatus performance can readily be made from a visual inspection of the image of the object produced by the apparatus and/or quantitative analysis of data produced by the apparatus for use in presentation of the image. Such data typically comprises the brightness value of each pixel of the image produced by the apparatus, pixel brightness being a function of the total NMR signal detected by the apparatus as arising from the part of the object being imaged corresponding to that pixel.

A known form of NMR phantom comprises an enclosure made of a material which produces an effectively zero NMR response when imaged by the apparatus. Within the enclosure there may be disposed various suitably shaped members of the same or another zero NMR response material, the whole of the remainder of the interior of the enclosure being filled with a material of known NMR response. The material of known NMR response is required to have a highly homogeneous distribution of protons of the kind which are to be excited to resonance in use of the apparatus. Where, as is usual, the protons to be excited are hydrogen protons, a suitable material of known NMR response for use in an NMR phantom is a copper sulphate solution or manganese chloride solution or other solution containing free hydrogen ions.

Since NMR imaging apparatuses are normally required to image a planar slice of an object, thereby to provide a cross-sectional view of the object in the plane of the slice, or in the case where imaging of a volume of an object is required, a plurality of parallel spaced planar slices disposed within the volume, NMR imaging phantoms typically have a tubular enclosure, the phantom being disposed in use so that the apparatus under test displays images of one or more planar slices of the phantom extending parallel to the plane ends of the enclosure.

The shaped members of the phantom, if present, are designed with a view to assessment of various parameters of the image. For example, to assess the spatial resolution of the image the shaped members typically comprise a number of spaced rods of different diameters extending parallel to the axis of the enclosure, and/or a series of plates disposed in planes parallel to the axis of the enclosure, the plates being of different thicknesses and different spacings.

To assess the image under different conditions of contrast, different regions of the phantom enclosure may be of different internal length i.e. so as to contain different depths of the material of known NMR response.

However, there does not exist at the prsent time an NMR imaging phantom which enables a satisfactory quantitative assessment of the thickness of the slice of an object being imaged.

Furthermore, there does not exist at the present time a form of NMR imaging phantom which enables a satisfactory quantitative assessment of spatial resolution under different conditions of contrast in the image, e.g. under different conditions of proton density in the object being imaged.

A further problem which arises in assessing the performance of NMR imaging apparatus is that there does not exist a satisfactory method of comparing the performance of an apparatus when operating in different modes.

It is an object of the present invention to provide NMR imaging phantoms and methods of using such phantoms which provide these facilities.

In accordance with a first aspect of the invention there is provided an NMR imaging phantom comprising an enclosure containing a member of a first material having a first known NMR response, the member being shaped so as to provide in a planar slice intersecting said member a length of said material whose dimension in the direction of the width of the slice varies linearly along said length of material from substantially zero to a value equal to the thickness of the slice; and the enclosure being otherwise filled in the direction of the thickness of the slice, at least over said length, with a second material having a second known NMR response.

Said first known response is preferably a substantially zero NMR response.

Said member is suitably at least part of a wedge-shaped block.

The invention also provides a method of using a phantom in accordance with the first aspect of the invention to determine the thickness of a planar imaged slice.

Thus, in accordance with a second aspect of the invention there is provided a method of assessing the thickness of a slice of a body imaged by an NMR imaging apparatus comprising: disposing in an examination chamber of an NMR apparatus a phantom according to the first aspect of the invention; positioning the phantom and operating the apparatus so as to obtain an image of a planar slice of the phantom which intersects said member parallel to and within said slice intersecting said member; deriving the edge response function of the imaged slice along said length of said first material; and differentiating said edge response function to obtain a thickness profile of the imaged slice.

In accordance with a third aspect the invention provides an NMR imaging phantom comprising a plurality of enclosures each of which contains a material of different known NMR response, the enclosures being shaped so as each to provide a length of a said material of continuously decreasing width in a plane intersecting the enclosures.

Preferably each enclosure is shaped to provide a length of said material of width decreasing linearly to zero.

Said enclosures are suitably wedge-shaped.

Preferably said enclosures are identically shaped.

The invention also provides a method of using a phantom according to the third aspect of the invention to assess the spatial resolution of an NMR imaging apparatus under different conditions of contrast.

Thus in accordance with a fourth aspect of the invention there is provided a method of assessing the spatial resolution of an NMR imaging apparatus under different conditions of contrast comprising; disposing in an examination chamber of the NMR apparatus a phantom according to the third aspect of the invention; positioning the phantom and operating the apparatus so as to obtain an image of a planar slice of said phantom parallel to said plane intersecting said enclosures; and determining for each enclosure the distance from the wider end of that enclosure at which the image of that enclosure disappears.

The invention further provides a method of assessing the performance of an NMR imaging apparatus which facilitates a comparison of the performance of an apparatus when operating in different modes.

Thus, according to a fifth aspect the present invention a method of assessing the performance of an NMR imaging apparatus comprises obtaining a measure of the ratio of the contrast of the image produced by the apparatus for two different values of a chosen parameter; obtaining a measure of the standard deviation of the brightness of the image produced at said different values of said chosen parameter; and obtaining a measure of the ratio of said contrast ratio and said standard deviation.

Said chosen parameter is typically the spin to spin or spin to lattice relaxation time constant of material of a body being imaged.

Two NMR phantoms in accordance with the invention and methods according to the invention will now be described by way of example with reference to the accompanying drawings in which:

FIG. 1 is a plan view of the first phantom;

FIGS. 2, 3 and 4 are sectional views of the first phantom along the lines II—II, III—III, and IV—IV in FIG. 1 respectively;

Figure 4:
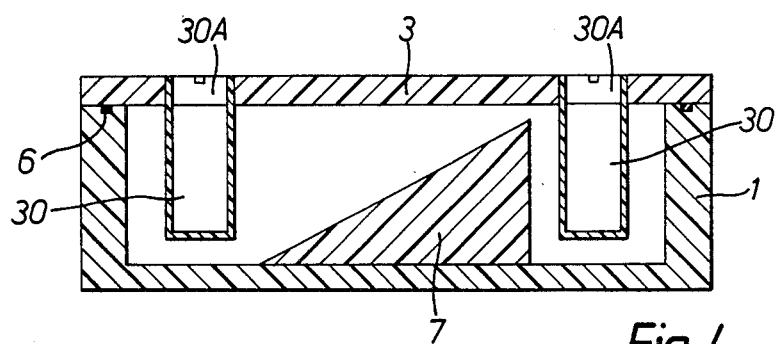

Referring to FIGS. 1 to 4, the phantom has a short tubular housing made of a transparent plastics material, the housing comprising a cup-shaped body portion 1 and a lid 3 which is secured to the body portion by screws 5 of plastics material, the lid being sealed to the body portion by an 'O' ring 6.

Within the housing there are disposed two right-angled wedge-shaped blocks 7 and 9 of plastics material. The blocks 7 and 9 are of the same length, height and wedge-angle, but one block 9 if half the width of the other block 7. The wider block 7 is secured to the base of the body portion 1 at one side of the housing with its base in contact with the base of the body portion 1. The narrower block 9 is secured to the lid 3 of the housing so that its inclined surface is in parallel spaced relationship with the inner half of the inclined surface of the wider block 7 when the lid 3 is secured to the body portion 1 of the housing.

The housing also contains a number of rods 11 of plastics material of different diameters, the rods being secured to the lid 3 so as to be disposed to one side of the blocks 7 and 9 in parallel spaced relationship, with their axes parallel to the axis of the housing when the lid 3 is secured to the body portion 1 of the housing.

To the other side of the blocks 7 and 9, secured to the lid 3, there are four sets 13, 15, 17 and 19 of three parallel spaced plates of plastics material, the plates in each set being of a different thickness and spacing equal to their thickness.

At the side of the housing opposite the blocks 7 and 9, secured to the base of the body portion 1, there is a further, generally rectangular block 21 of plastics material. In the block 19 there are formed three holes 23, 25 and 27. One hole 23 extends centrally through the block 21 in a direction parallel to the axis of the housing. The other two holes 25 and 27 extend through the block 19 on opposite sides of the central hole 23 at the same angle, typically about 20°, to the base of the body portion 1, although the two holes are oppositely directed.

Where the holes 25 and 27 meet the surface of the block 21 the surface of the block is bevelled so as to be perpendicular to the axis of the holes.

Between the block 21 and the blocks 7 and 9 there is a set of thin wedge-shaped plates 29 of plastics material, the plates being secured to the base of the body portion 1 in a fan arrangement with their narrower ends meeting in a line extending parallel to the axis of the housing adjacent the block 21.

At each end of the blocks 7 and 9 and at each end of the block 21 there is disposed one of four identically shaped tubular inserts 30 of plastics material filled with a material of known NMR response, the materials in the four inserts 30 having different NMR responses. The inserts 30 are secured within holes in the lid 3 with their axes parallel to the axis of the housing, the inserts being fitted with removable plugs 30A to allow the material in the inserts to be changed.

The whole of the space within the housing not occupied by members of plastics materials is filled with a solution having a known NMR response, e.g. a solution of copper sulphate or manganese chloride in de-ionised water. The solution may be doped with sodium chloride so that the NMR response of the solution more nearly simulates that of a human body, the sodium chloride serving to distribute the NMR responsive free hydrogen ions in the solution.

A hole is provided in the curved wall of the body portion 1 of the housing to permit filling the housing with solution, the hole being plugged by a screw 31 of plastics material.

The plastics material is chosen to have a substantially zero NMR response compared with the solution used to fill the housing.

In use the phantom is disposed in the examination chamber of an NMR apparatus under test, and the apparatus is operated to image a planar slice extending through the interior of the housing of the phantom in a direction parallel to the flat ends of the phantom.

An assessment of the performance of the apparatus is made by visual and semi-quantitative assessment of the images of the rods 11, and plates 13, 15, 17, 19 and 29 in conventional manner. It will be appreciated in this connection that if the image indicates NMR response on a grey scale with zero NMR response corresponding to black, the plastic objects all appear black on the image surrounded by a bright display.

The narrower block 9 and the opposed part of the wider block 7 provide a visual indication of the position of the imaged slice with respect to the phantom. Thus the area of the image corresponding to the narrower block 9 and the opposed part of the block 7 will appear black except for a bright bar extending parallel to the width of the block 9 corresponding to the region where the image slice intersects the gap between the blocks 7 and 9. As best seen from FIG. 2, as the image slice is moved from the base of the housing towards the lid 3, the bright bar moves from one end of the block 7 to the other.

The part of the wider block 7 not opposed by the narrower block (see FIG. 1) is used for making a quantitative assessment of the width of the image slice.

Figure 7:
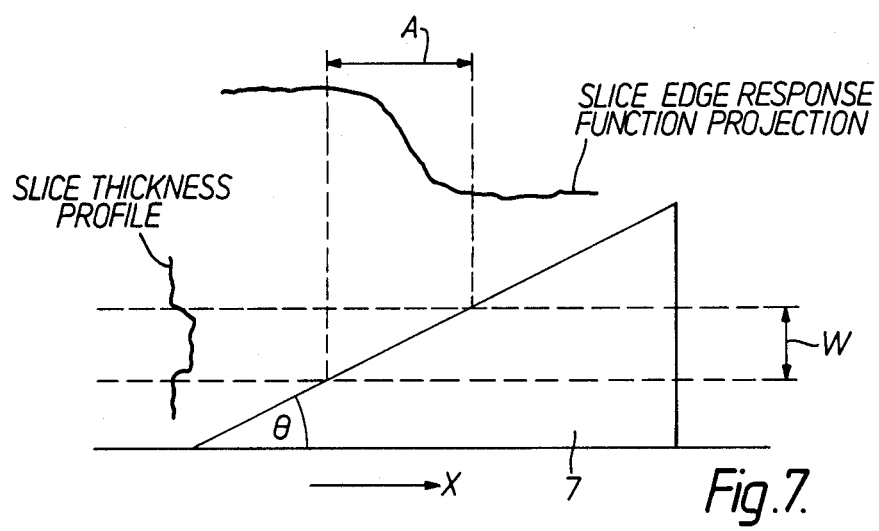
FIG. 7 is a diagram illustrating said first method.

Referring now to FIG. 7, in the region where the image slice intersects the inclined surface of the block 7, the proportion of the width of the image slice which is occupied by material of the block 7 varies from 1 to 0 in a direction towards the thinner end of the block 7. Thus the corresponding image varies from black to maximum brightness over this region.

Figure 5:
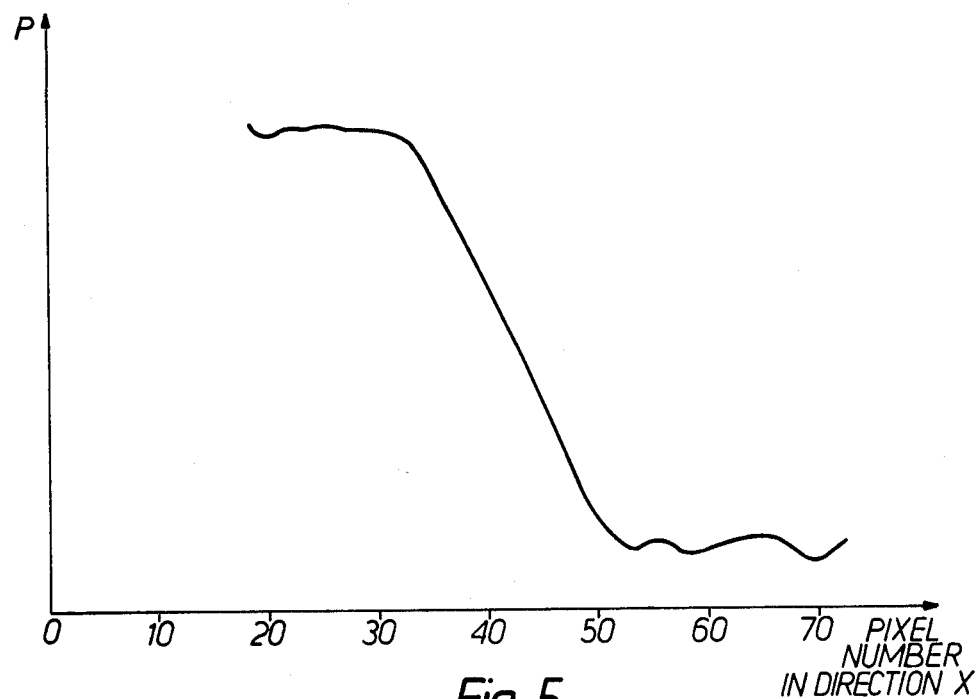
FIGS. 5 and 6 are graphs illustrating a first method of using the first phantom to determine the width of an imaged slice.

Slice width is assessed by taking the brightnesses P of pixels of the image on a line extending in a direction X parallel to the length of the block 7 across the above-mentioned region where the image slice intersects the inclined face of the block 7. It will be appreciated that these brightness values are preferably taken from data computed to display the image rather than by brightness measurements made on the displayed image. The brightness values are then plotted on a graph against pixel number in the direction X, as illustrated in FIG. 5 by way of example. The slope dP/dX of the resulting graph is then plotted against pixel number in the direction X, as illustrated in FIG. 6.

Figure 6:
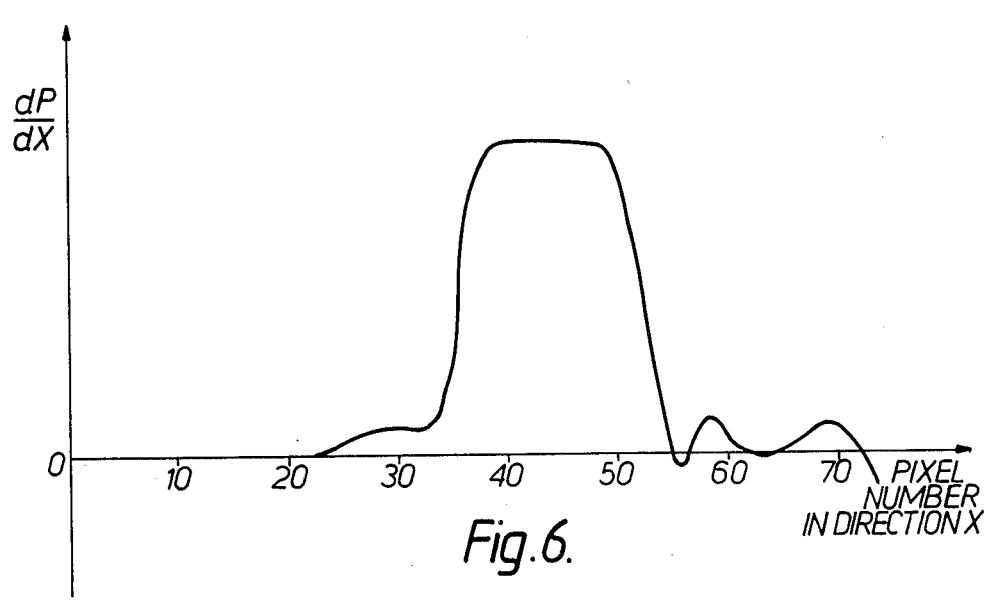

Slice width may then be quantitatively assessed by measurement on the graph of FIG. 6.

Typically slice width will be measured where the value of dP/dX has half its maximum value. The graph of FIG. 6 is used to obtain the X-direction dimension A at this level. The slice width W is then obtained from the expression A Tan $\theta$ where $\theta$ is the wedge-angle of the block 7, as illustrated in FIG. 7.

It will be appreciated that the graph of FIG. 6 in fact represents the image slice thickness profile.

The measured pixel brightness values represent the edge response function projection of the slice in the X-direction which is a convolution of the slice thickness profile with a ramp function determined by the wedge-angle of the block 7. Hence the slice profile is obtained when the edge response function projection is deconvolved by differentiation.

The graph of FIG. 6 also permits a quantitative assessment of the percentage of the area of the slice profile lying within the chosen limits, e.g. the half maximum dP/dX level.

It will be noted that the graph of FIG. 6 also gives a useful indication of the spurious out-of-slice NMR responses obtained with the apparatus.

In conventional methods of assessing the performance of NMR imaging apparatus slice width is assessed by Fourier analysis of the detected resonance signal or the RF pulses used to excite resonance in the slice. It will be appreciated that a phantom according to the invention enables a direct much more accurate assessment of slice width to be obtained, since measurement is made on the actual image obtained.

The phantom illustrated in FIGS. 1 to 4 is suitable for assessing the performance of an NMR imaging apparatus when imaging a single slice of a body. It will be appreciated that for assessing performance when imaging a volume of a body i.e. a plurality of parallel spaced slices, a phantom of greater length is required, e.g. about 90 centimetres in length. The blocks 7 and 9 will then have a larger wedge-angle e.g. about 60° instead of about 30° as shown. The position and width of each slice and the inter-slice spacing of the slices can then all be measured as described above.

The image of block 21 may be used in conventional manner as a partial volume effect gauge, i.e. to allow contrast ratio of the image to be assessed.

Figure 8:
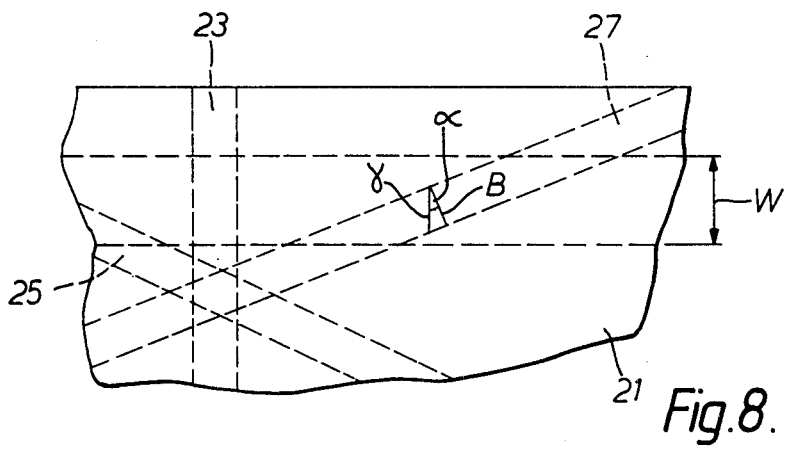
FIG. 8 is a diagram illustrating a second method of using the first phantom to determine the width of an imaged slice.

However, the image of the block 19 may also be used to obtain a rapid indication of slice width, as follows;

Referring to FIG. 8, so long as the slice width is greater than the dimension $\gamma$ of the holes 25 and 27 in the direction of the width of the slice, then slice width W is given by the expression $$W = \gamma/S$$

where S is the ratio of the maximum brightness of the image of ther hole 25 or 27 (i.e. at the centre of the image) to the brightness of the image of the hole 23. It will be appreciated that $\gamma$ is given by B/cos $\alpha$ where B is the diameter of the holes 25 and 27 and is the angle that the holes 25 and 27 make with the base of the body portion 1 of the housing.

The inserts 30 are used to obtain a better assessment than is possible using the block 21 of the contrast ratio of the image, i.e. the difference in brightness between images of materials having known different properties, e.g. different spins to lattice relaxation time constants T1, or spin to spin relaxation time constants T2.

To this end the materials filling the inserts are suitably manganese chloride solutions having strengths in the range $5.00 \times 10^{17}$ Mn++ions/milliliter to $1.00 \times 10^{16}$ Mn++ions/milliliter. In one embodiment used in practice the four solutions are of strengths $4.37 \times 10^{17}$(T1=150 ms, T2=30 ms at 21 MHz)

$2.30 \times 10^{17}$(T1=250 ms, T2=60 ms)

$1.15 \times 10^{17}$(T1=440 ms, T2=120 ms) and $3.41 \times 10^{16}$(T1=840 ms, T2=300 ms)

A quantitative assessment of the contrast ratio of the image produced by an apparatus in respect of T1 or T2 can be obtained using the expression $$\frac{\rho_T - \rho_{T''}}{\rho_T + \rho_{T''}}$$

where $\rho_T$ is the proton density, i.e. mean image brightness, for the material of an insert 30 with the apparatus operating in a mode in which image brightness is primarily dependent on the chosen relaxation time constant T1 or T2, and the suffixes ' and '' indicate respective ones of two selcted inserts 30 whose T1 or T2 values lie at the ends of a range of T1 or T2 values of interest.

A figure of merit for an apparatus under test in respect of T1 or T2 may be obtained using the expression:

$$\frac{\left(\dfrac{\rho_T - \rho_{T''}}{\rho_T + \rho_{T''}}\right) \times \dfrac{100}{\Delta LnC}}{\overline{\sigma/M} \times 100} \quad (1)$$

where LnC is the difference of the natural logs of the concentrations of the solutions in the two selected inserts 30 and $\overline{\sigma/M}$ is the mean of $\sigma/M$ for the two selected inserts 30, $\sigma$ being the standard deviation of the brightness over the area of the image of an insert, and M being the mean value of the brightness over the area of the image of an insert.

It will be appreciated that $\Delta LnC = T' - T''$.

Hence, the figure of merit is the ratio of the contrast ratio of the image, expressed as a percentage of the chosen range of the selected time constant T1 or T2, and the standard deviation of the image brightness, expressed as a percentage of the mean of image brightness.

For a given pair of inserts 30 expression (1) may be reduced to:

$$\frac{k\left(\frac{\rho T' - \rho T''}{\rho T' + \rho T''}\right)}{\sigma/M} \quad (2)$$

where k is a constant.

It will be appreciated that the inverse of the term $\sigma/M$ gives a measure of the signal to noise ratio of the image. It will thus be understood that the higher is the 'figure of merit' obtained then the better may one expect to be able to distinguish visually between areas of materials of different relaxation time constant T1 or T2 in the image obtained.

It will be understood that whilst in the above example a figure of merit has been obtained in respect of the performance of the apparatus for distinguishing between areas of an image of different T1 or T2 value, the method may also be used to obtain a figure of merit in respect of the performance of an apparatus for distinguishing between areas of an image having different values of another parameter e.g. temperature.

Figure 9:
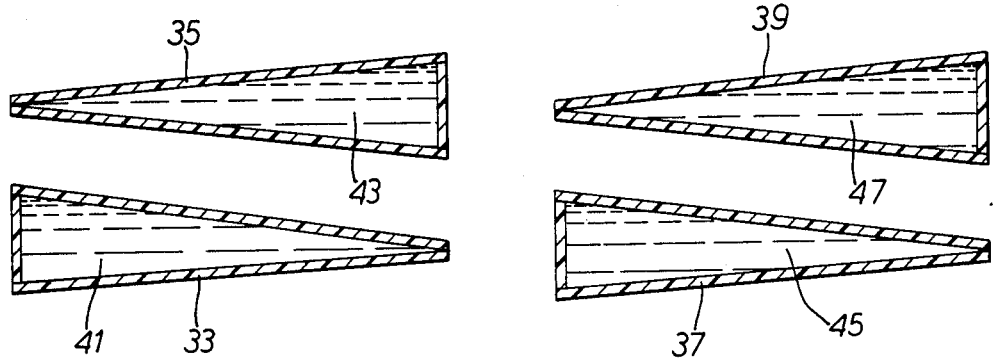
FIG. 9 is a sectiohal plan view of the second phantom.
Figure 10:
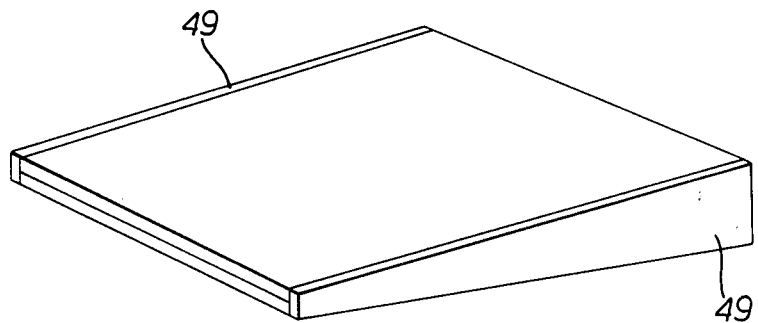
FIG. 10 is a perspective view of one of four enclosures constituting the phantom of FIG. 9.

Referring now to FIGS. 9 and 10, the second phantom comprises four identically shaped and sized hollow wedge-shaped enclosures 33, 35, 37 and 39. Each of the enclosures is made of clear plastics material having a substantially zero NMR response. Each enclosure is filled with a material, 41, 43, 45 or 47, e.g. a solution, having a known NMR response, the materials in the different enclosures having different NMR responses.

The triangular ends of the enclosures, (see 49 in FIG. 10) are suitably substantially in the form of isosceles triangles having a smallest angle of about 3°.

The filling material is suitably a solution of manganese chloride, the concentrations of the solutions lying in the range $5.00 \times 10^{17}$ Mn++ions/milliliter to $1.00 \times 10^{16}$ Mn++ions/milliliter. In one embodiment used in practice solutions of concentrations $3.41 \times 10^{16}$, $1.15 \times ^{17}$, $2.30 \times 10^{17}$ and $4.37 \times 10^{17}$ Mn++ions/milliliter respectively were used for the four enclosures.

In use of the phantom the four enclosures are disposed in the examination chamber of an NMR apparatus under test, the enclosures being disposed so that when the apparatus is operated to image a slice, the slice extends through each enclosure in a direction parallel to the triangular ends of each enclosure.

The enclosures are suitably arranged in spaced pairs, as shown in FIG. 9, and may be secured to the outside of another phantom, e.g. to the curved wall of the phantom of FIGS. 1 to 4, with their triangular ends parallel to the lid 3 and the base of the body portion 1.

A quantitative assessment of the spatial resolution of the apparatus is obtained from the images of the four enclosures. Cut-off resolution is indicated by the distance from the wider end of each enclosure at which the image of that enclosure disappears. Thus a figure for cut-off resolution is obtained at each of four values of the contrast ratio. It will be appreciated that cut-off resolution may be more accurately assessed from an inspection of the computed brightness values for pixels along lines extending along the lengths of the enclosures, than by observation of displayed images of the enclosures.

I claim:

1. An NMR imaging phantom comprising an enclosure containing a member of a first material having a first known NMR response, the member being shaped so as to provide in a planar slice intersecting said member a length of said material whose dimension in the direction of the width of the slice varies linearly along said length of material from substantially zero to a value equal to the thickness of the slice; and the enclosure being otherwise filled in the direction of the thickness of the slice, at least over said length, with a second material having a second known NMR response.

2. A phantom according to claim 1 wherein said first known response is substantially zero NMR response.

3. A phantom according to claim 2 wherein said member consists of a plastics material.

4. A phantom according to claim 1 wherein said member is at least part of a wedge-shaped block or a multiple number of wedge-shaped blocks with low ramp angle and with such blocks overlap each other, or using a spiral wedge-shaped block; both arrangements will enhance the resolution of the measurements.

5. A phantom according to claim 4 wherein said member is constituted by part of a wedge-shaped block another part of which block has a planar face in parallel spaced relationship with a planar face of a further member of said first material in the form of a wedge-shaped block such that the gap between said planar faces extends transversely across said planar slice at an acute angle.

6. A phantom according to claim 5 wherein said enclosure comprises a cup-shaped portion and a lid portion and said wedge-shaped blocks are secured one to the lid and the other to the base of the cup-shaped portion.

7. A method of assessing the thickness of a slice of a body imaged by an NMR imaging apparatus comprising disposing in an examination chamber of the NMR imaging apparatus a phantom comprising an enclosure containing a member of a first material having a first known NMR response, the member being shaped so as to provide in a planar slice intersecting said member a length of said material whose dimension in the direction of the width of the slice varies linearly along said length of material from substantially zero to a value equal to the thickness of the slice; and the enclosure being otherwise filled in the direction of the thickness of the slice, at least over said length, with a second material having a second known NMR response; positioning the phantom and operating the apparatus so as to obtain an image of a planar slice of the phantom which intersects said member parallel to and within said slice intersecting said member; deriving the edge response function of the imaged slice along said length of said first material; and differentiating said edge response function to obtain a thickness profile of the imaged slice.

8. A method according to claim 7 wherein said edge response function is derived from computed data as opposed to measurements made on a display of an image of the phantom.

9. An NMR imaging phantom comprising a plurality of enclosures each of which contains a material of different known NMR response, the enclosures being shaped so as each to provide a length of a said material of continuously decreasing width in a plane intersecting the enclosures.

10. A phantom according to claim 9 wherein each said enclosure is shaped to provide a length of said material of width decreasing linearly to zero.

11. A phantom according to claim 9 wherein said enclosures are wedge-shaped.

12. A phantom according to claim 9 wherein said enclosures are of substantially identical shape.

13. A method of assessing the spatial resolution of an NMR imaging apparatus under different conditions of contrast in an image comprising: disposing in an examination chamber of the NMR imaging apparatus a phantom comprising a plurality of enclosures each of which contains a material of different known NMR response, the enclosures being shaped so as each to provide a length of a said material of continuously decreasing width in a plane intersecting the enclosures; positioning the phantom and operating the apparatus so as to obtain an image of a planar slice of said phantom parallel to said plane intersecting said enclosures; and determining for each enclosure the distance from the wider end of that enclosure at which the image of that enclosure disappears.

14. A method according to claim 13 wherein determination of said distance at which each image of an enclosure disappears is carried out from inspection of computed data as opposed to observation of a display of an image of the phantom.

15. A method of assessing the performance of an NMR imaging apparatus comprising: obtaining a measure of the ratio of the contrast of the image produced by the apparatus for two different values of a chosen parameter; obtaining a measure of the standard deviation of the brightness of the image produced at said different values of said chosen parameter; and obtaining a measure of the ratio of said contrast ratio and said standard deviation.

16. A method according to claim 15 wherein said ratio of the contrast is the ratio of the difference of the brightnesses of the images produced for said two different values of the chosen parameter and the brightness of the image for one of said two different values.

17. A method according to claim 15 wherein said measure of the ratio of the contrast is said ratio of the contrast expressed as a fraction of the difference between said two values of said chosen parameter.

18. A method according to claim 15 wherein said measure of the standard deviation is said standard deviation expressed as a fraction of the mean of the image brightness.

19. A method according to claim 18 wherein said measure of the standard deviation is the mean of the ratio of the standard deviation and mean of the brightness of the image over a first area of a body being imaged by the apparatus in which first area said chosen parameter has one of said two values and the ratio of the standard deviation and mean of the brightness of the image over a second area of the body being imaged by the apparatus in which second area said chosen parameter has the other of said two values.

20. A method according to claim 15 wherein said chosen parameter is the spin to spin relaxation time constant (T2) of material of a body being imaged.

21. A method according to claim 15 wherein said chosen parameter is the spin to lattice relaxation time constant (T1) of material of a body being imaged.

* * * * *

UNITED STATES PATENT AND TRADEMARK OFFICE
CERTIFICATE OF CORRECTION

PATENT NO. : 4,613,819        Page 1 of 2
DATED      : September 23, 1986
INVENTOR(S): Kui M. Chui It is certified that error appears in the above-identified patent and that said Letters Patent is hereby corrected as shown below:

Column 1, line 7, "1n" should be --In--

Column 3, line 36, "sectiohal" should be --sectional--

Column 6, lines 44-45, "$\dfrac{\rho_T - \rho_{T'}}{\rho_T + \rho_{T'}}$" should be --$\dfrac{\rho_{T'} - \rho_{T''}}{\rho_{T'} + \rho_{T''}}$--

Column 6, equation (1), "$\dfrac{\left(\dfrac{\rho_T - \rho_{T'}}{\rho_T + \rho_{T'}}\right) \times \dfrac{100}{\Delta \text{LnC}}}{\sigma/M \times 100}$" should be --$\dfrac{\left(\dfrac{\rho_{T'} - \rho_{T''}}{\rho_{T'} + \rho_{T''}}\right) \times \dfrac{100}{\Delta \text{LnC}}}{\overline{\sigma/M} \times 100}$--

Column 6, line 66 "$\sigma/M$" should be --$\overline{\sigma/M}$--

UNITED STATES PATENT AND TRADEMARK OFFICE
CERTIFICATE OF CORRECTION

PATENT NO. : 4,613,819  Page 2 of 2
DATED : September 23, 1986
INVENTOR(S) : Kui M. Chui It is certified that error appears in the above-identified patent and that said Letters Patent is hereby corrected as shown below:

Column 7, equation (2), $"\dfrac{k\left(\dfrac{\rho_T - \rho_{T'}}{\rho_T + \rho_{T'}}\right)}{\sigma/M}"$ should be $--\dfrac{k\left(\dfrac{\rho_{T'} - \rho_{T''}}{\rho_{T'} + \rho_{T''}}\right)}{\sigma/M}--$ Column 7, line 50, "1.15X $^{17}$" should be --1.15X10$^{17}$--

Signed and Sealed this

Sixteenth Day of December, 1986

Attest:

DONALD J. QUIGG

Attesting Officer    Commissioner of Patents and Trademarks